United States Patent
Ren et al.

(10) Patent No.: US 7,442,284 B2
(45) Date of Patent: Oct. 28, 2008

(54) COATED CARBON NANOTUBE ARRAY ELECTRODES

(75) Inventors: Zhifeng Ren, Newton, MA (US); Jian Wen, Newton, MA (US); Jinghua Chen, Chestnut Hill, MA (US); Zhongping Huang, Belmont, MA (US); Dezhi Wang, Wellesley, MA (US)

(73) Assignee: The Trustees of Boston College, Chestnut Hill, MA (US)

( * ) Notice: Subject to any disclaimer, the term of this patent is extended or adjusted under 35 U.S.C. 154(b) by 0 days.

(21) Appl. No.: 11/595,561

(22) Filed: Nov. 9, 2006

(65) Prior Publication Data
US 2007/0134555 A1 Jun. 14, 2007

Related U.S. Application Data

(62) Division of application No. 10/305,804, filed on Nov. 27, 2002, now Pat. No. 7,147,966.

(60) Provisional application No. 60/334,328, filed on Nov. 30, 2001.

(51) Int. Cl.
*H01M 4/66* (2006.01)
(52) U.S. Cl. .................. 205/159; 205/317; 204/294
(58) Field of Classification Search ............ 205/159, 205/317; 204/294
See application file for complete search history.

(56) References Cited

U.S. PATENT DOCUMENTS

| | | | |
|---|---|---|---|
| 6,097,138 A | 8/2000 | Nakamoto | 313/309 |
| 6,099,960 A | 8/2000 | Tennent et al. | 428/367 |
| 6,205,016 B1 | 3/2001 | Niu | 361/503 |
| 6,283,812 B1 | 9/2001 | Jin et al. | 445/24 |
| 6,312,303 B1 | 11/2001 | Yaniv et al. | 445/24 |
| 6,346,775 B1 | 2/2002 | Lee et al. | 315/169.3 |
| 6,707,098 B2 | 3/2004 | Hofmann et al. | 257/324 |
| 6,716,409 B2 | 4/2004 | Hafner et al. | 423/447.1 |
| 6,808,746 B1 | 10/2004 | Dai et al. | 427/249.1 |
| 7,112,315 B2 | 9/2006 | Kiang | 423/447.1 |
| 7,118,693 B2 | 10/2006 | Glatkowski et al. | 252/502 |
| 7,147,966 B2 * | 12/2006 | Ren et al. | 204/294 |

(Continued)

FOREIGN PATENT DOCUMENTS

JP 2000-203819 7/2000

(Continued)

OTHER PUBLICATIONS

International Search Report based on PCT/US02/38262 dated Mar. 20, 2003.

*Primary Examiner*—Scott Kastler
(74) *Attorney, Agent, or Firm*—Greenberg Traurig, LLP; David J. Dykeman

(57) ABSTRACT

The present invention provides conductive carbon nanotube (CNT) electrode materials comprising aligned CNT substrates coated with an electrically conducting polymer, and the fabrication of electrodes for use in high performance electrical energy storage devices. In particular, the present invention provides conductive CNTs electrode material whose electrical properties render them especially suitable for use in high efficiency rechargeable batteries. The present invention also provides methods for obtaining surface modified conductive CNT electrode materials comprising an array of individual linear, aligned CNTs having a uniform surface coating of an electrically conductive polymer such as polypyrrole, and their use in electrical energy storage devices.

19 Claims, 10 Drawing Sheets

U.S. PATENT DOCUMENTS

| | | | |
|---|---|---|---|
| 2001/0023986 A1 | 9/2001 | Mancevski | 257/741 |
| 2001/0051367 A1 | 12/2001 | Kiang | 435/182 |
| 2002/0112814 A1 | 8/2002 | Hafner et al. | 156/272.2 |
| 2002/0153160 A1 | 10/2002 | Hofmann et al. | 174/117 |
| 2004/0071949 A1 | 4/2004 | Glatkowski et al. | 428/313.3 |
| 2004/0120879 A1 | 6/2004 | Chen et al. | 423/447.1 |

FOREIGN PATENT DOCUMENTS

| | | |
|---|---|---|
| JP | 2000-277002 | 10/2000 |
| WO | WO 00/63115 | 10/2000 |

\* cited by examiner (a)

(b)

COATED CARBON NANOTUBE ARRAY ELECTRODES

RELATED APPLICATIONS

This application is a divisional of U.S. application Ser. No. 10/305,804, filed Nov. 27, 2002, now U.S. Pat. No. 7,147,966 which claims priority to U.S. Provisional Application Ser. No. 60/334,328, filed on Nov. 30, 2001, and the entirety of these applications are hereby incorporated herein by reference for the teachings therein.

STATEMENT AS TO FEDERALLY SPONSORED RESEARCH

The present invention was made with partial support from the US Army Natick Soldier Systems Center under grant No. DAAD 16-00-C-9227, Department of Energy under grant No. DE-FG02-00ER45805, the National Science Foundation under grant No. DMR-9996289 and the U.S. Army Research Office under grant No. DAAD19-00-1-0001.

FIELD OF THE INVENTION

The present invention relates generally to electrically conductive carbon nanotube electrode materials, methods for their preparation and their use as electrodes in high performance rechargeable batteries.

BACKGROUND OF THE INVENTION

Carbon nanotubes (CNTs) offer significant advantages over other materials in that they possess substantially higher strength-to-weight ratios and superior mechanical properties. Since their discovery, there have been numerous disclosures in the art pertaining to synthesis and morphology of CNTs, including methods for controlling tubule growth during their formation. Efforts to realize many potential applications envisaged for CNTs include their modification to produce new one-dimensional nanoscale materials, introduction of foreign materials by capillary and electric arc methods, and conversion into nanoscale carbide materials such as silicon carbide (SiC), tungsten carbide (WC), etc. by reacting them with the corresponding metal-oxides.

Electrically conductive polymers (ECPS) have been studied extensively over the past two decades. Simple ECPs, typically polypyrrole (PPy), polyaniline (PAni), polythiophene (PTh) and polyacetylenes (PA), can be prepared either chemically or electrochemically. Besides having relatively high conductivity in oxidized and ion-doped states, simple ECPs also show interesting physicochemical properties that are potentially useful in batteries, energy storage cells, sensors, capacitors, light-emitting diodes, and electrochromic displays. For many of these applications, especially in batteries, a high charge capacity is required. In order to increase the charge capacity of a polymer battery, the doping charge of the polymer film must be increased. This goal can be practically achieved by increasing the film thickness of ECPs. However, it has been found that the electrical performance of conducting polymers is strongly influenced by the kinetics of the doping-undoping process of ions within the film. For a conventional PPy electrode, increasing the film thickness causes deterioration of electrodic performance (e.g., charging-discharging rate) due to the long ion diffusion time and migration length in the thick film. It has been shown that a porous PPy structure with large specific surface area is a prerequisite for high-power applications due to the high charging and discharging rates. Films of nitrile-butadiene rubber (NBR) when used as a template for oriented growth of PPy in NBR matrix-grown PPy electrodes possess an open, porous structure with high surface area admitting a faster anion doping process than ordinary PPy electrodes.

Methods for coating metals and organic conductive polymers on the surface of CNTs to produce one-dimensional nanoscale composites can be used in battery, magnetic storage, fuel cell, and composite applications, since they are extremely porous substrates with large surface area and possess good mechanical properties. The use of carbon substrates for improving mechanical properties of electrically conducting polymers is known. This method however, requires greater than 25% (by weight) of polypyrrole to be deposited on the fibers in order to achieve a continuous phase that is critical for electrical conductance. Efforts to use CNTs as viable substrates for electrically conducting materials disclosed in the art have been largely limited to fabrication of one-dimensional nanoscale composites of CNTs containing polypyrrole (PPy), nickel (Ni), Cobalt (Co), titanium (Ti), tungsten (W), palladium (Pd), gold (Au), aluminum (Al) and iron (Fe). Such composites, which are typically obtained by chemical synthesis, physical vapor deposition and electron-beam evaporation methods however, do not provide coating uniformity on the CNT surface, which is critical for their application in energy storage devices. This limitation is mainly attributable to tangling and isolation of randomly distributed CNTs in an array, resulting in overlapping of individual CNTs within the array and loss of coating contiguity, and therefore, causes electrical insulation between individual CNTs.

SUMMARY OF THE INVENTION

The present invention provides CNT electrode materials comprising aligned CNT substrates coated with an electrically conducting polymer and the fabrication of electrodes for use in electrical energy storage devices such as fuel cells and capacitors. In particular, the present invention provides surface modified carbon nanotube (CNTs) electrode material whose electrical properties render them suited for use in energy storage devices such as rechargeable batteries. More specifically, the present invention provides methods for obtaining surface modified CNT electrode materials comprising a CNT substrate containing a substantially uniform surface coating of an electrically conducting polymer such as polypyrrole (PPy), wherein the CNT substrate comprises an array of individual linear CNTs are aligned with respect to one another. Linear CNTs as defined herein, refer to CNTs that do not contain branches originating from the surface of individual CNT tubules along their linear axes. The redox performance of the polymer coated CNT electrodes of the present invention is superior to conventional, flat titanium (Ti) and platinum (Pt) electrodes due to their substantially larger accessible surface area. The porosity of the electrodes of the invention, due to the hollow structure of the individual tubules within the aligned arrays, results in an especially large film formation charge ($Q_{film}$) that is desirable for construction of high performance rechargeable batteries. The linear CNT tubules of the present invention further comprise a substantially uniform coating of an electrically conductive polymeric material. Preferably, the coated linear CNTs are aligned in an array. The present invention further comprises methods for using the energy storage CNT electrode materials in electrical storage devices.

The electrically conducting CNT electrode material of the invention includes an aligned CNT array that is obtainable by known methods disclosed in the art. Such methods involve growing a CNT array on a metallic material containing a catalyst that is deposited on a surface. The catalyst facilitates CNT nucleation and the growth process on the metallic surface. In one embodiment, titanium (Ti) is used as a base surface upon which a nickel (Ni) layer is deposited (as the catalyst) by magnetron sputtering. Depending on the thickness of the catalytic Ni layer and growth time of CNTs, tubules having uniform lengths and similar diameters are obtainable. An electrically conducting polymeric film is subsequently deposited uniformly on the entire surface of individual tubules in the CNT array. In a preferred embodiment, the polymer film is formed in-situ and deposited on the CNT tubule surface. The in-situ synthesis and deposition of the electrically conducting polymer film can be carried out by electrochemical polymerization of the corresponding monomer from either an aqueous solvent or mixed solvents in the presence of the aligned CNT array. The polymer coatings in the electrodes of the invention are rendered adherent by pretreatment of CNT substrates with an acidic solution prior to the coating process.

The in-situ formation of electrically conducting polymer film on CNT tubules by the methods of the present invention enables control of coating uniformity and film thickness of the electrically conducting coating polymer on individual tubules in the CNT array. The coating methods of the present invention overcome limitations of polymer solution coating methods to obtain electrically conducting polymer films on substrates. Such limitations include film non-uniformity and variable coating thickness, which result in producing defects that produce electrically-insulating domains on the substrate surface.

The present invention further provides methods for polymerizing monomers capable of forming electrically conducting polymeric films directly on the CNT surface in their doped or undoped states. Preferably, a solution containing the monomer is contacted with the CNT array substrate, following which the monomer is electrochemically polymerized in-situ to provide a uniform polymeric coating on the surface of individual CNT tubules comprising the substrate.

In one aspect, the present invention provides a uniform film coating comprising an electrically conducting polymer, such as for example, polypyrrole (PPy) on a CNT substrate material having linear, longitudinally aligned array of tubules. The electro-deposition of conductive polymeric films on the CNT substrate material is preferably carried out in an inert atmosphere (in the absence of oxygen) to provide a surface coatings that are distributed uniformly and contiguously over the entire tubule surface. In another aspect, the CNT substrate material is pretreated with an aqueous acid, such as a mineral acid, to improve conductive polymer film adhesion to the substrate surface.

The present invention also provides methods of fabricating the conducting polymer coated CNT electrode material into electrodes that are capable of charging and discharging electrical energy, thereby enabling their use as electrodes in energy storage and dispensation devices such as rechargeable batteries. The electrical storage properties of the CNT electrodes of the present invention can be measured by standard methods such as cyclic voltammetry.

An advantage of the CNT coating methods of the present invention is that they enable the formation of highly uniform, contiguous, thin electrically conducting polymer films on a light weight mechanically strong, highly porous CNT substrate. The methods of the invention, therefore, provide electrode materials for fabrication of electrodes that are capable of superior electrical charge retention properties, enabling their use in high performance energy storage devices such as rechargeable batteries relative to conventional materials. Such devices utilizing electrodes of the present invention therefore, provide advantages of portability and fewer charge cycle requirement in comparison with devices containing conventional electrodes. The CNT electrode materials of the present invention, therefore, improve both performance and life of rechargeable batteries.

In one aspect, the present invention provides carbon nanotube (CNTs) substrates comprising uniform and contiguous electrically conducting polymer coatings that are capable of functioning as electrodes in energy storage devices.

In another aspect, the present invention provides methods for coating CNT substrates with electrically conducting materials, particularly electrically conducting polymers that are capable of functioning as electrode materials.

In another aspect, the present invention provides methods of utilizing CNT substrates coated with electrically conducting materials as electrodes in energy storage devices such as rechargeable batteries.

It is yet another aspect of the present invention to provide CNT electrodes containing electrically conducting polymers that are doped with n-type or p-type dopants for enhanced electrical conductivity.

The foregoing and other objects, features and advantages of the invention will become more apparent from the following description of the figures and detailed description of particular embodiments.

BRIEF DESCRIPTION OF THE DRAWINGS

The objects and features of the invention can be better understood with reference to the following detailed description and accompanying figures.

Figure Legends: PPy-coated aligned CNT substrate with $Q_{film}$=86.1 mC/cm$^2$ (———); PPy films on flat Ti with $Q_{film_2}$=93.3 mC/cm$^2$ (······); and Pt with $Q_{film}$=111.4 mC/cm$^2$ (----).

Figure 8:
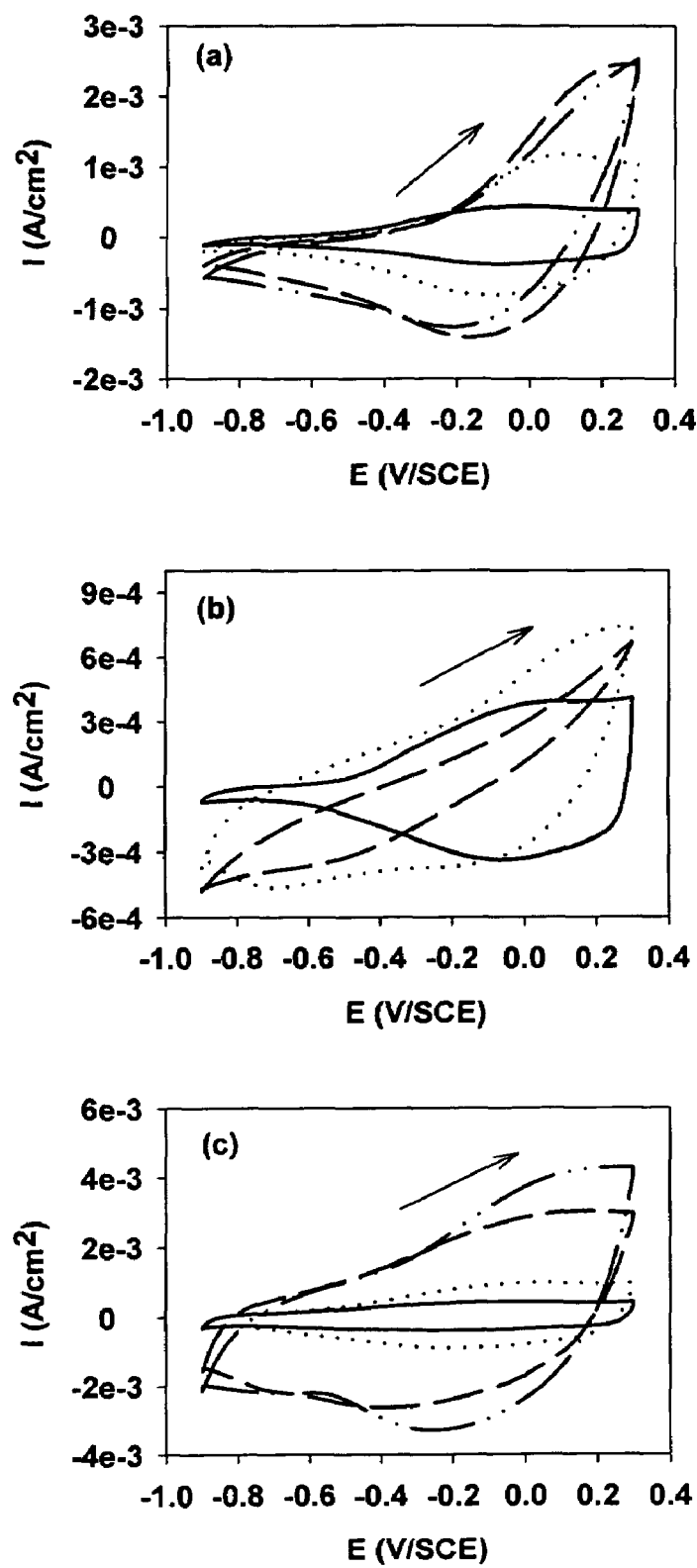

FIG. 8 shows cyclic voltammograms of PPy films with different $Q_{film}$ in 0.1M LiClO$_4$ monomer-free aqueous solutions. Scan rate: 50 mV/s; Potential range:−0.9-+0.3 V/SCE; Initial potential:−0.9 V/SCE.

(8a) PPy films on flat Pt substrates, $Q_{film}$: 111.4 mC/cm$^2$ (———); 307.5 mC/cm$^2$ (···); 686.2 mC/cm$^2$ (-----); 933.2 mC/cm$^2$ (—··—).

(8b) PPy films on flat Ti substrates, $Q_{film}$: 93.3 mC/cm$^2$ (———); 227.7 mC/cm$^2$ (···); 645.1 mC/cm$^2$ (------).

(8c) PPy-coated aligned CNT substrate, $Q_{film}$: 86.1 mC/cm$^2$ (———); 207.9 mC/cm$^2$ (· · ·); 681.9 mC/cm$^2$ (------); 1308.6 mC/cm$^2$ (—··—).

Figure 9:
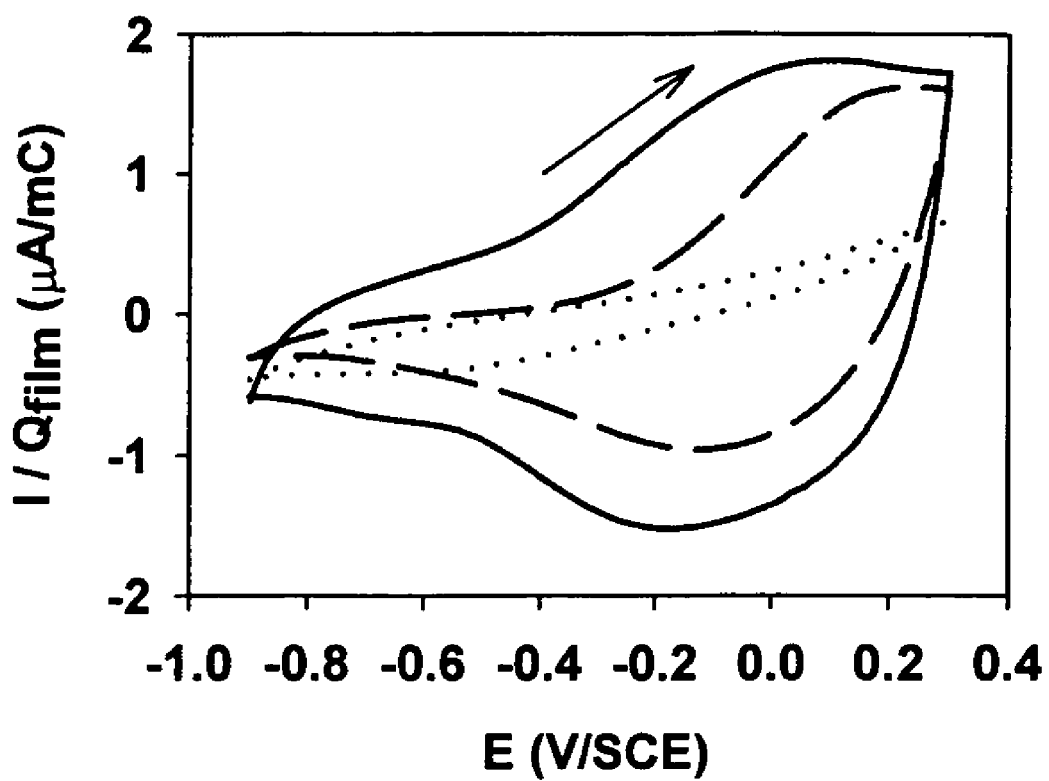

FIG. 9 shows cyclic voltammograms of the PPy films with large $Q_{film}$ in 0.1M LiClO$_4$ monomer-free aqueous solutions. Scan rate: 25 mV/s; Potential range:−0.9-+0.3 V/SCE; Initial potential:−0.9 V/SCE.

Figure Legends: PPy-coated aligned CNT substrate with $Q_{film}$=1308.6 mC/cm$^2$ (———); PPy films on the flat Ti with $Q_{film_2}$=645.1 mC/cm$^2$ (······) and Pt with $Q_{film}$=933.2 mC/cm$^2$ (-----).

Figure 10:
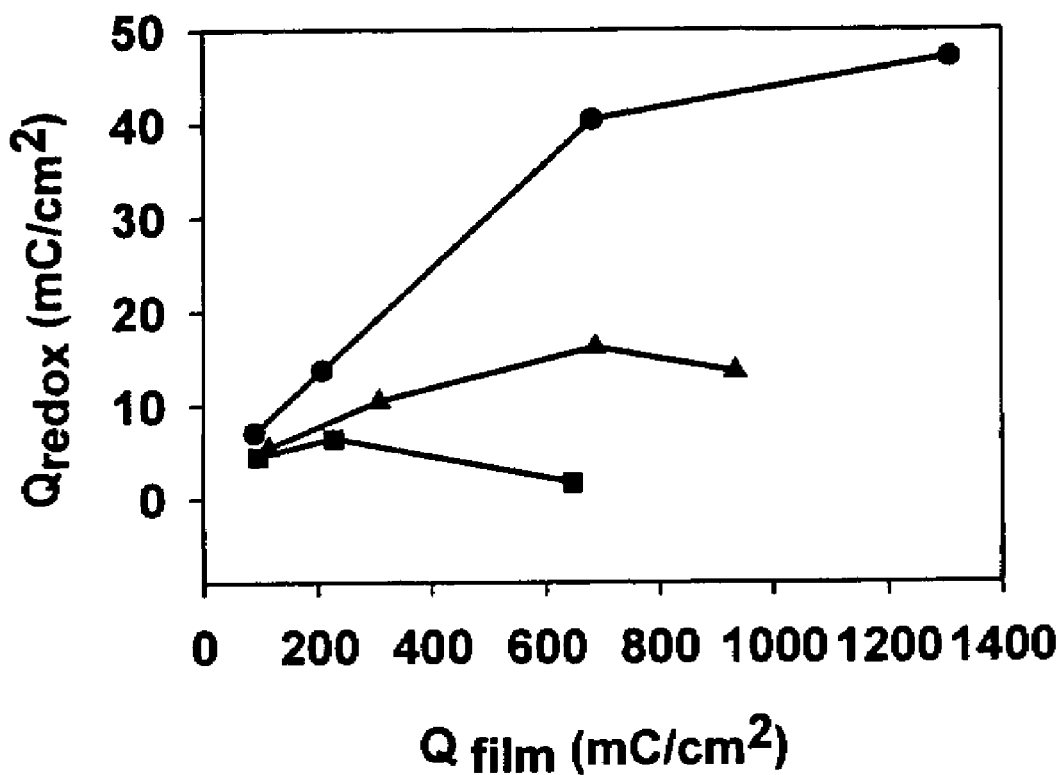

FIG. 10 shows the dependence of redox charge ($Q_{redox}$) of Ppy aligned CNT substrate (●), PPy/Pt (▲) and PPy/Ti (■) films on film formation charge ($Q_{film}$). $Q_{redox}$ is estimated from anodic charge of the cyclic voltammogram at 50 mV/s.

DETAILED DESCRIPTION OF THE INVENTION

In one aspect, the present invention relates to high surface area conductive CNT electrode materials comprising of a CNT array substrate material capable of supporting an adherent electrically conducting polymer coating. In one embodiment, the CNT electrode material comprises a porous substrate material such as, for one example a plurality of linear CNTs having a pre-determined tubule morphology. The morphology of individual tubules comprising the CNTs can be cylindrical with a hollow core, or stacked conical segments ("bamboo-like"). Alternatively, the porous substrate material can be comprised of CNT tubules having a mixture of both morphologies.

In one embodiment of the present invention, the CNT substrate material is comprised of an array of aligned linear CNTs wherein the longitudinal axis of individual tubules are oriented in a plane substantially parallel to one another.

In another embodiment, the CNT substrate material forms one or more bundles upon being coated with the conductive polymer film. A bundle as referred to herein, refers to an aggregation of a plurality of individual tubules within an array and cohesively held together by the conductive polymeric film. Thus the plurality of tubules forming a bundle are packed densely enough to produce multiple points of electrical contract between individual coated tubules, thereby establishing electrical continuity throughout the three-dimensional array of CNTs within the bundle. Alignment of the individual carbon nanotubes within a bundle is dependent on the film thickness of the electrically conductive polymer coating. In a preferred embodiment, individual CNT bundles are free standing, that is, they do not require a supporting base substrate to maintain tubule array integrity in their individual bundles.

In another aspect, the present invention provides conductive CNT electrode materials comprising porous CNT substrate materials having a substantially uniform and contiguous surface coating that is comprised of one or more electrically conductive polymers.

The CNT electrode materials of the present invention are useful in the fabrication and manufacture of electrodes for incorporation in high-efficiency energy storage devices such as rechargeable batteries, fuel cells and capacitors. In a one embodiment, the porous CNT substrate comprises an aligned array of CNTs, wherein CNT tubules within the array comprise a surface coating of at least one electrically conductive polymer. The electrically conductive polymers of the invention are known in the art, and comprise essentially polymers having an extensively π-conjugated backbones. Examples of electrically conductive polymers of the present invention include but are not limited to, for example, polypyrrole (PPy), polyaniline (PAni), polythiophene (PTh), polyacetylene (PA) and derivatives, and combinations thereof. In one embodiment, the conductive CNT electrode material comprises a plurality of electrically conductive polymers that are deposited as layered films on the surface of the CNT substrate. In a currently preferred embodiment, the electrically conductive polymer is polypyrrole (PPy).

In another aspect, the invention provides a method of producing CNT electrode materials that are free-standing (not bound to a support material) with good mechanical and electrical properties. In one embodiment, the free-standing, CNT electrode material comprises an aligned CNT substrate array coated with an electrically conductive polymer. In another embodiment, the CNT array substrate material, when subjected to the coating process of the invention, so as to provide a conductive electrical polymer film of finite thickness on the surface of individual tubules, results in "bundles" comprising an aggregate of a plurality of individual tubules. The individual tubules within each bundle are randomly aligned within a series of mutually parallel planes in a manner so as to provide a dense packing that is cohesively held together by the electrically conductive polymer coating material. This, in turn, provides multiple points of contact among individual tubules comprising the bundle, thereby establishing electrical continuity throughout the tree-dimensional array within each bundle. Individual bundles can, therefore, be rendered free-standing by peeling them off the CNT growth support surface, thereby providing free-standing conductive CNT electrode material. In a currently preferred embodiment, the CNT substrate is a well-aligned array of linear CNTs, and the electrically conducting polymer coating free-standing porous substrate electrode is polypyrrole (PPy).

In a further aspect, the present invention provides methods for obtaining CNT electrode materials by coating porous CNT substrates with electrically conductive polymer films. In one embodiment, the coating process comprises coating the CNT substrate with an electrically conductive polymer dissolved in a suitable solvent, followed by removal of the solvent from the coated CNT surfaces by standard method to result in an electrically conductive polymer film coating. The polymer concentration in the coating solution can be varied to control film thickness. In a preferred embodiment, porous CNT substrates are coated with an electrically conductive polymer film by in-situ polymerization of corresponding monomers from solution directly on the CNT substrate surface. This method provides deposition of substantially uniform, homogeneous and contiguous polymer films that are substantially defect-free, and possess superior electrical properties. Electrically conductive polymers useful for the coating process of the invention include, but are not limited to, polypyrrole (PPy), polyaniline (PAni), polythiophene (PTh), polyacetylene (PA) and their substituted derivatives. The polymer coating preferably is obtained by in-situ solution polymerization of the corresponding monomeric compounds by electrochemical, photochemical or chemical methods. In a currently preferred embodiment, the electrically conducting polymer is PPy, which is obtained by direct electrochemical polymerization from a solution containing the corresponding pyrrole monomer on the surface of the CNT substrate array.

In a currently preferred method, the direct in-situ polymerization of pyrrole on CNT array substrates involves a pre-polymerization de-aeration step wherein nitrogen gas is bubbled through an aqueous electrolyte solution (for example, 0.1M lithium perchlorate ($LiClO_4$))containing dissolved pyrrole monomer for about 30 minutes to eliminate dissolved oxygen. The CNT array substrate materials are pre-treated with an aqueous mineral acid solution, such as for example 15% wt. aqueous $HNO_3$, for about 30 minutes to remove traces of adherent metallic catalyst particles on individual CNT tubules. The polymerization process is subsequently carried out in a nitrogen atmosphere by standard electrochemical methods. The polymerization reaction is initiated potentiodynamically using a standard three-electrode cell, wherein the CNT substrate functions as one electrode, and a platinum wire functions the counter electrode in the electrolyte solution containing the pyrrole monomer. A saturated calomel electrode (SCE) is used as the reference electrode. The polymerization reaction and the film thickness of the deposited PPy films are monitored by cyclic voltametry. PPy films are also electro-deposited on the flat metal surfaces (titanium and platinum) in a substantially similar manner to enable comparison of film adhesion and durability in the CNT electrode materials of the invention. All polymerization reactions are carried out at ambient temperature, and all potentials are referred to the saturated calomel electrode (SCE).

Specific attributes and advantages of the electrode materials of the invention, as well as methods for their preparation, are described below with reference to relevant figures.

Figure 1:
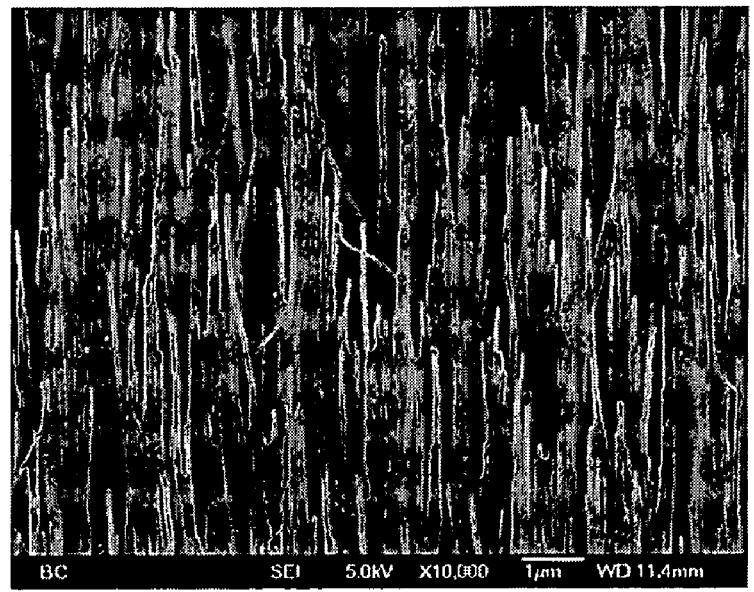
FIG. 1 shows SEM micrographs of (a) an aligned CNT array substrate (D: 80 nm; L: 10 µm) grown on flat titanium substrate and (b) aligned CNT array substrate (tubule diameter: 50-70 nm, length: 3-4 µm) grown on a titanium substrate by plasma-enhanced chemical vapor deposition.
Figure 1:
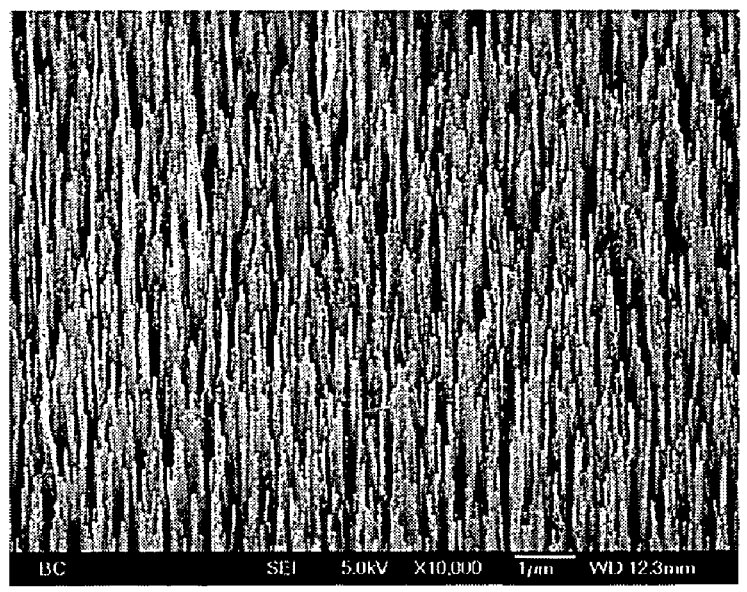

FIG. 1a shows the typical morphology of as grown, aligned CNT array substrate materials comprising a plurality of individually aligned tubules on a nickel coated titanium surface. The individual tubule diameter ranges from about 50-100 nm, and tubule length range from about 8-10 microns (μm), depending on the layer thickness of the nickel (Ni) catalyst and tubule growth time, respectively. FIG. 1b shows well-aligned carbon nanotubes (diameter: 50-70 nanometers (nm), length: 3-4 μm) grown on a titanium substrate by plasma-enhanced chemical vapor deposition.

Figure 2:
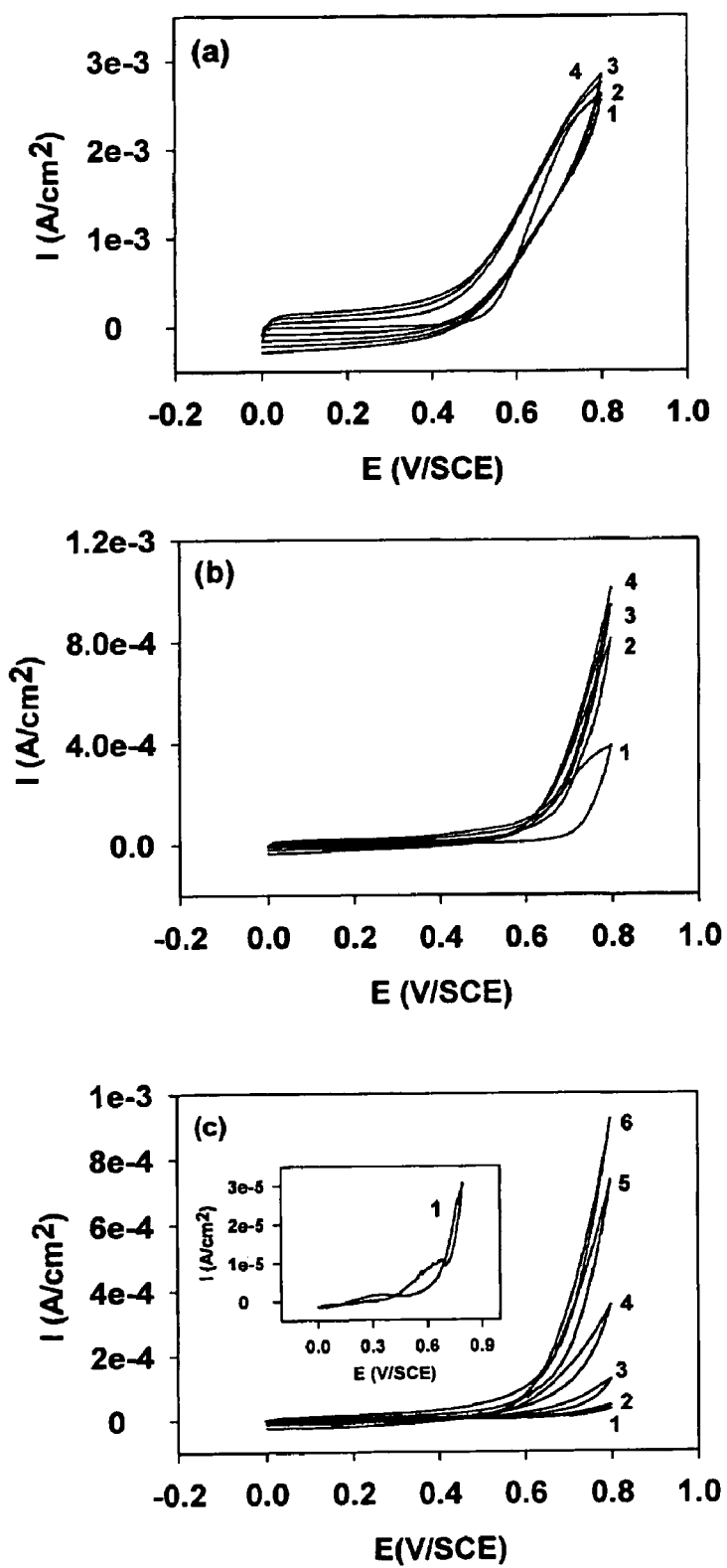
FIG. 2 illustrates the potentiodynamic polymerization of PPy films in 0.1M LiClO$_4$ aqueous solutions. Monomer concentration (pyrrole): 17.3 mM; Scan rate: 5 mV/s; Potential range: 0.0-0.8 V/SCE; Initial potential: 0.0 V/SCE; Substrates: aligned CNT array (a), Pt (b) and Ti (c).

FIG. 2 shows the current voltage response during the electrochemical synthesis of PPy films on the well-aligned CNT array substrate material (2a) in comparison with those on flat metal (Pt, and Ti) electrodes (2b, and 2c), respectively. The initial deposition of the PPy film begins at a potential of about 0.4 volts (V) in all cases. The growth behavior on the aligned CNT array substrate material is, however, very different from that on the flat metallic substrates. On flat metallic substrates (e.g. Ti and Pt), the growth current ($\approx$+0.8V) of PPy is very small (about $3.06\times10^{-5}$ amperes/centimeter$^2$ (A/cm$^2$) and $3.91\times10^{-4}$ A/cm$^2$ for Ti and Pt, respectively) in the first cycle, which then increases in value for each subsequent cycle. This behavior is indicative of a relatively high nucleation energy requirement at the beginning of the PPy film growth on metallic substrates. In contrast, on the aligned CNT array substrates, the current ($\approx$+0.8V) in the first growth cycle is about $2.57\times10^{-3}$ A/cm$^2$, which is more than 80 times greater than that on Ti substrate, and about 6.5 times greater than that on the Pt substrate. No significant increase of the current ($\approx$+0.8V) is observed on the CNT array substrate materials electrode in sequential cycles, while the current ($\approx$+0.8V) is still much larger than that for either the Ti or Pt substrate. This behavior is attributed to the following: 1) the CNT array substrate material has a substantially high actual surface area due to the nanometer dimensions of individual tubules; 2) the surface of the CNT array substrate is more active (greater surface roughness) than that of flat metallic substrates; a lower nucleation energy is therefore required to initiate surface mediated polymerization of pyrrole; 3) the pre-treatment of CNT array material substrates in aqueous acid solutions, such as aqueous nitric acid, causes tubule surface oxidation, and introduces chemical functional groups on the tubule surface such as carboxylic acids. This enables the resulting oxidized, ionic (anionic) tubules act as a dopant, and improve polymerization of PPy.

Figure 3:
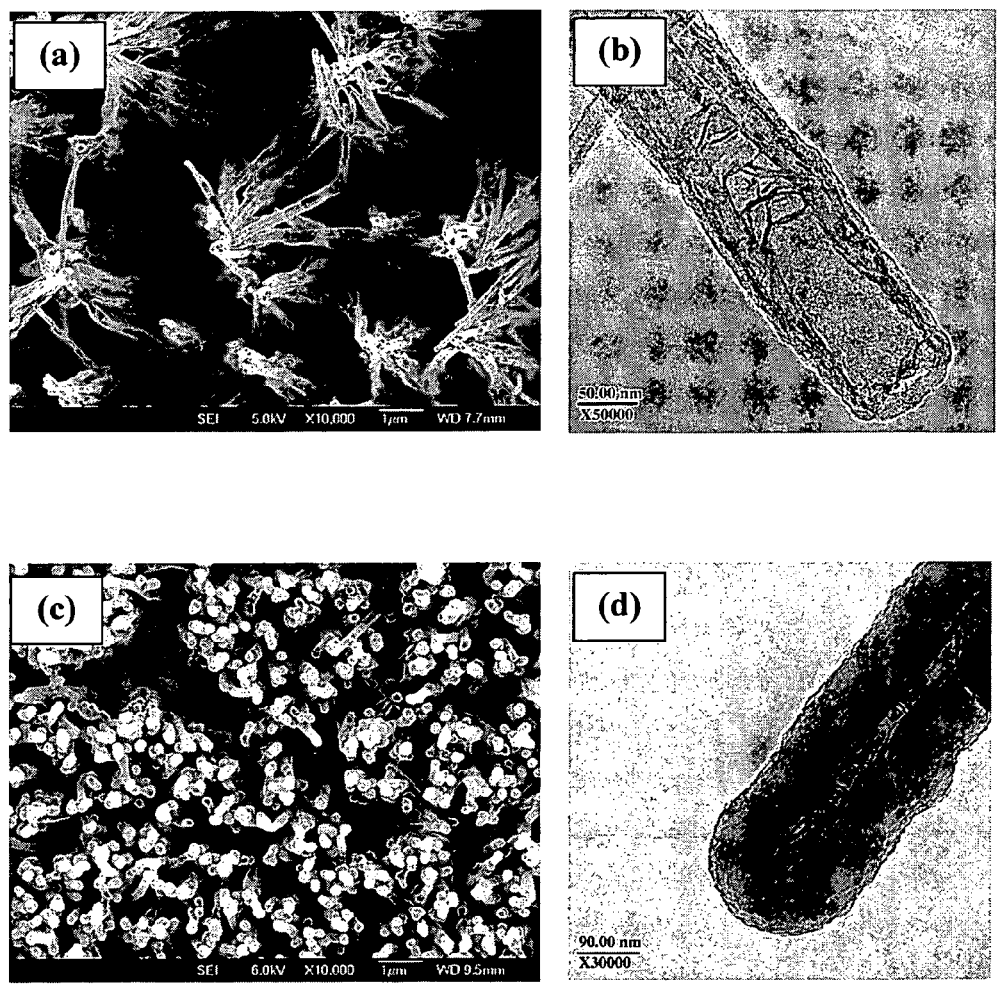
FIG. 3 shows SEM micrographs (3a and 3c) and the corresponding TEM micrographs (3b and 3d) images of PPy films grown on aligned CNT array substrates with different film formation charge ($Q_{film}$). 3a, 3b: 86.1 mC/cm$^2$; 3c, 3d: 1308.6 mC/cm$^2$.
Figure 4:
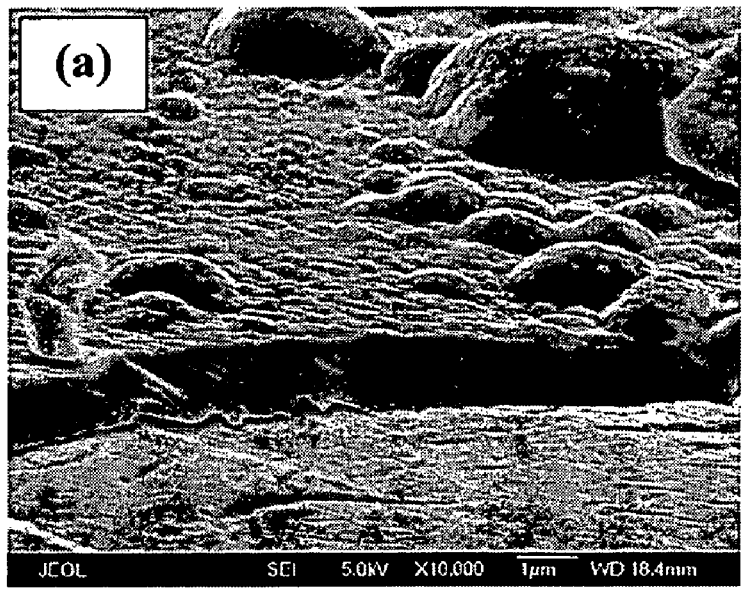
FIG. 4 shows cross-sectional SEM images of PPy films grown on the flat metal substrates: 4a Ti (645.1 mC/cm$^2$); 4b Pt (933.2 mC/cm$^2$).
Figure 4:
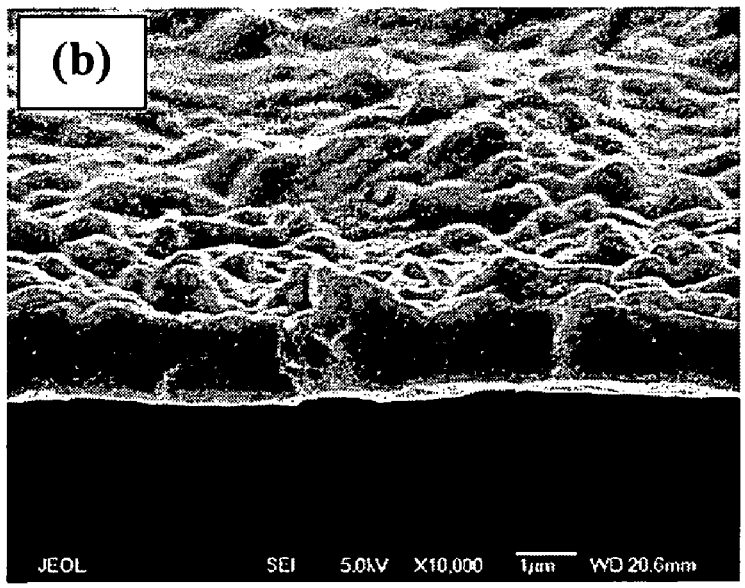

FIG. 3 shows SEM and TEM micrographs that illustrate the morphologies of PPy-coated conductive CNT electrode material with varying film thickness; comparative the SEM micrographs showing the cross-sectional morphologies of the PPy films grown on flat Ti and Pt substrates are shown in FIG. 4. As seen in FIG. 3, the coating methods of the present invention via in-situ polymerization provides highly uniform PPy films on the surface of individual CNT tubules, while the thickness of the PPy film is substantially smaller than those on the flat metal substrates (FIG. 4). A film thickness of about 90 nm (FIG. 3d) is typically obtained on the CNT substrate by passing a charge of about 1308.6 millicoulomb/centimeter$^2$ (mC/cm$^2$). In comparison, PPy film thicknesses of about 1.1 μm (FIG. 4b) and about 1.5 μm (FIG. 4d), result upon passing a charge of about 645 mC/cm$^2$ and about 933 mC/cm$^2$ on Ti on Pt substrates, respectively. The coating methods of the present invention, therefore, provide relatively superior conductive films on CNT array substrate materials in terms of both film uniformity and film thickness (the relatively thinner uniform films are less liable to exhibit defects due to cracking). Such uniform, thin film coatings of electrically conductive polymers on the CNT array substrate of the invention facilitate fast ion diffusion and migration within the polymers, thereby providing superior electrodic performance for the resulting conductive CNT electrode material. Additionally, a high charge capacity and the high charge efficiency for the PPy films can be attained in the conductive CNT electrode material of the invention.

Figure 5:
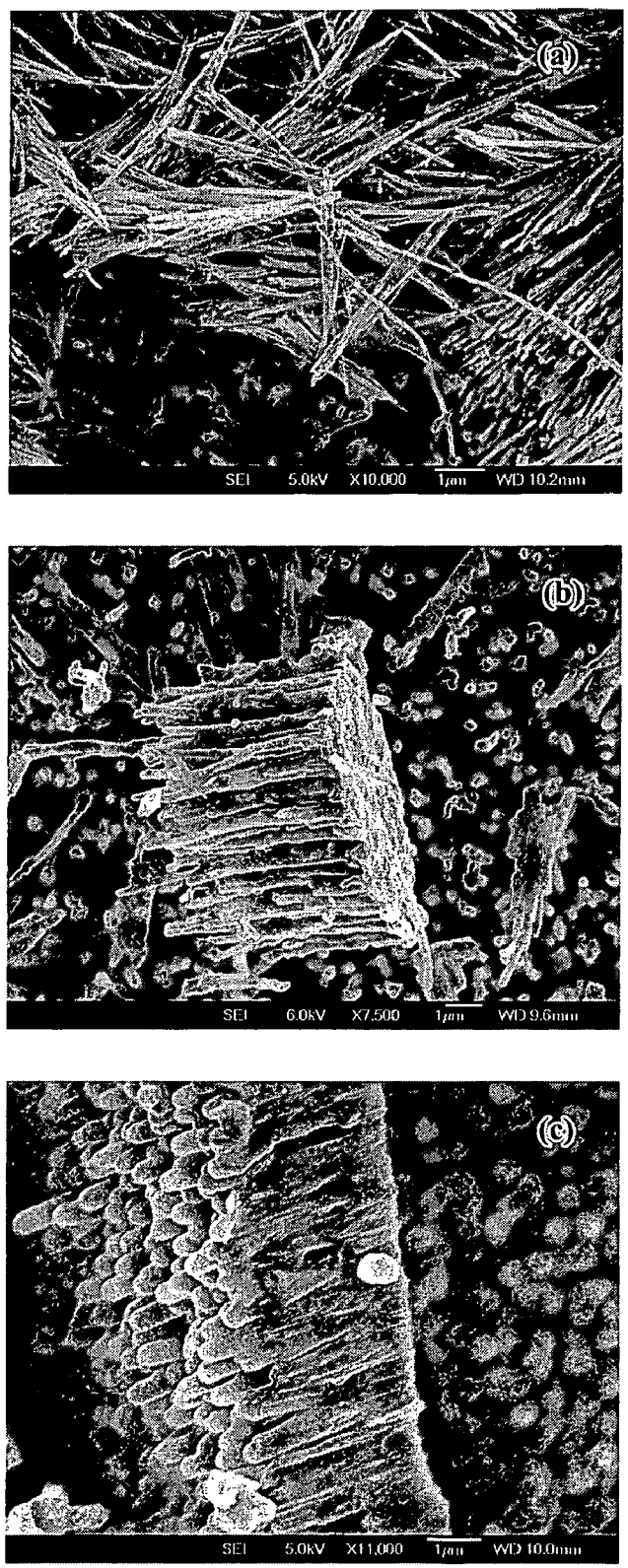
FIG. 5 shows SEM micrographs of free-standing conductive CNT electrode material comprised of Ppy coated aligned CNT array substrate material formed with different $Q_{film}$, removed from the CNT catalyst substrate: 5a 100.3 mC/cm$^2$; 5b 1308.6 mC/cm$^2$; 5c 1533.3 mC/cm$_2$.

Referring again to FIG. 3, a significant morphology difference is observable between PPy films of different thickness and differing film formation charges (FIGS. 3a and 3c). When the film formation charge ($Q_{film}$) is small (FIG. 3a), the PPy coating is thin (about 8 to 10 nm (FIG. 3b), and since the PPy-coated CNTs cannot stand individually, this leads to formation of bundles due to surface tension, which comprise an aggregation of a plurality of tubules. With increasing of $Q_{film}$, the thickness of the PPy film on the tubule surface increases to about 90 nm (FIG. 3d), thereby strengthening the coated tubules, free-standing tubules are obtained (FIG. 3c). As evidenced in these figures, the film uniformity in the coatings obtained by methods of the invention is independent of film thickness, thereby enabling control of film thickness without introduction of coating defects. The free-standing conductive CNT electrode materials of the invention can be rendered detachable as bundles comprising entire arrays from the catalytic surface on which the CNT arrays are grown (FIGS. 5(a)-(c)).

Figure 6:
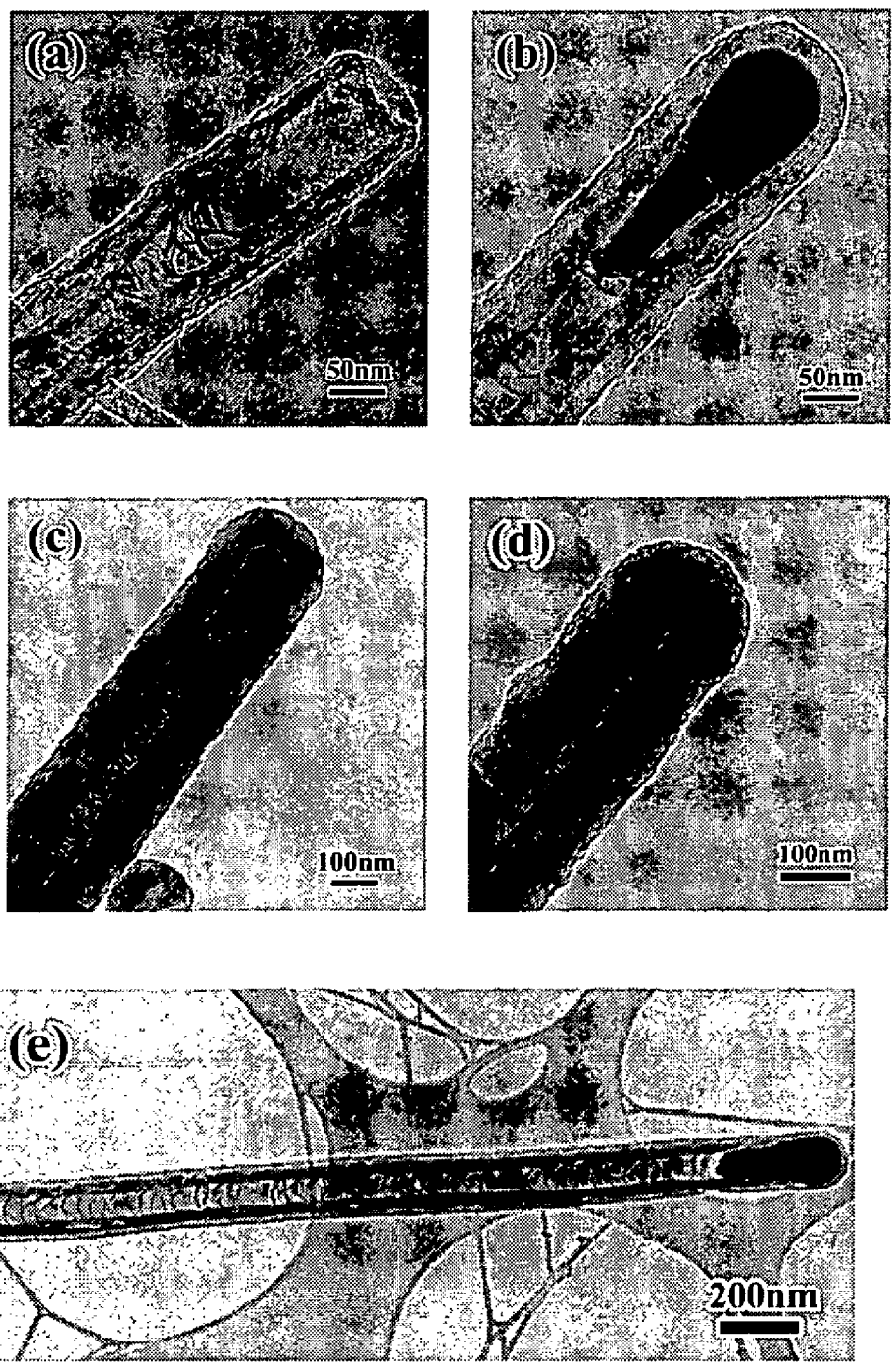
FIG. 6 TEM photomicrographs of Ppy coated aligned CNT array substrate with different film thickness due to different PPy film formation charge ($Q_{film}$): 6a 86.1 mC/cm$^2$; 6b 207.9 mC/cm$^2$; 6c 681.9 mC/cm$^2$; 6d 1308.6 mC/cm$^2$; 6e TEM image of a long PPy-coated carbon nanotube ($Q_{film}$: 681.9 mC/cm$^2$).

FIG. 6 shows transmission electron micrographs (TEM) illustrating the morphology of nanotube composites comprising the conductive CNT electrode material of the invention for different PPy film thickness. FIGS. 6(a) and 6(d) show that the removal of "catalytic caps" (developed during CNT tubule formation and growth) by an acidic pretreatment with aqueous $HNO_3$ solution, while FIGS. 6(b) and 6(c) show the presence of the catalyst at the tubule tip. Comparison of FIGS. 6(a) and 6(d) with 6(b) and 6(c) indicates that the catalyst particle (in this case, Ni) does not affect the electrochemical surface mediated synthesis of PPy films by the method of the invention. For both types of nanotubes, highly uniform PPy coatings are formed along the length of tubules; PPy film thickness is, however, different. Furthermore, when thickness of PPy film increases, the tubule tips are also covered uniformly by the PPy coating as seen in FIGS. 6(b), (c) and (d). As seen in FIGS. 6(a) and 6(d), no PPy coating deposition occurs on the surface of the inside-wall of the hollow CNT tubules although the tip is open. This is indicative of the fact that the electrolyte solution, due to surface tension effects, does not enter the tubules during PPy deposition. From the TEM micrographs shown in FIGS. 6(a)-(d), the thickness of PPy film and the diameter of the nanotube are related. The relationship tubule parameters, including diameter and length, $Q_{film}$, PPy film thickness, and the ratio of $Q_{film}$ to of PPy film thickness is shown in Table 1. These results show that thickness of the PPy film is linearly proportional to $Q_{film}$ up to about 681.9 $mC/cm^2$, suggesting that PPy film thickness can be controlled easily by $Q_{film}$ before reaching critical $Q_{film}$ (onset of non-linearity) by the method of the invention. FIG. 6(e) further shows that the PPy coating along a long length of individual tubules is contiguous and uniform, indicating that they do not touch each other during the electro-deposition polymerization method of the invention. The separation of individual tubules from each other may be due to surface charges that repel them from each other, resulting in non-contact between adjacent tubules during the polymerization process.

Contrary to conventional thick film ECPs on the flat substrates that peel off the substrate easily (for example, a PPy film peels off easily from Pt surfaces even when the film is relatively thin ($Q_{film}$ is about 933 $mC/cm^2$), the ECP films on the CNT substrates of the present invention exhibit good adhesion between the CNT substrate the ECP film. PPy films obtained by the methods of the invention do not peel off from the CNT substrate at relatively higher film thickness (when $Q_{film}$ is great as 1308.6 $mC/cm^2$). Most known conventional ECPs, such as PPy, PAni, etc., are mechanically weak. Strengthening of ECP films is typically achieved by the following: 1) co-polymerization of the ECP monomer with a second polymer such as poly(vinylchloride) (PVC) to produce mechanically superior films, which however, results in sacrifice of film electrical conductivity; 2) formation of composites with carbon materials, such as carbon black, that are limited by film non-uniformity, inadequate control of film thickness and coating defects. The in-situ polymerization coating methods on the CNT array substrates of the present invention overcome such limitations, imparting both high strength and excellent electrical conductivity to fabricated conductive CNT electrode materials, and rendering them capable of exhibiting superior electrodic performance in electrical storage devices.

TABLE 1

Relation between the nanotube parameters, film formation charge ($Q_{film}$), PPy film thickness, and $Q_{film}$/PPy thickness ratio.

| Sample | Diameter/Length of nanotubes (nm/μm) | $Q_{film}$ (mC/cm²) | Thickness of PPy films (nm) | $Q_{film}$/PPy Film Thickness |
|---|---|---|---|---|
| 1 | 90~110/10 | 86.1 | 10 | 8.61 |
| 2 | 80~100/13 | 207.9 | 22 | 9.45 |
| 3 | 100~120/5 | 681.9 | 76 | 8.97 |
| 4 | 30~50/7 | 1308.6 | 93 | 14.07 |

Figure 7:
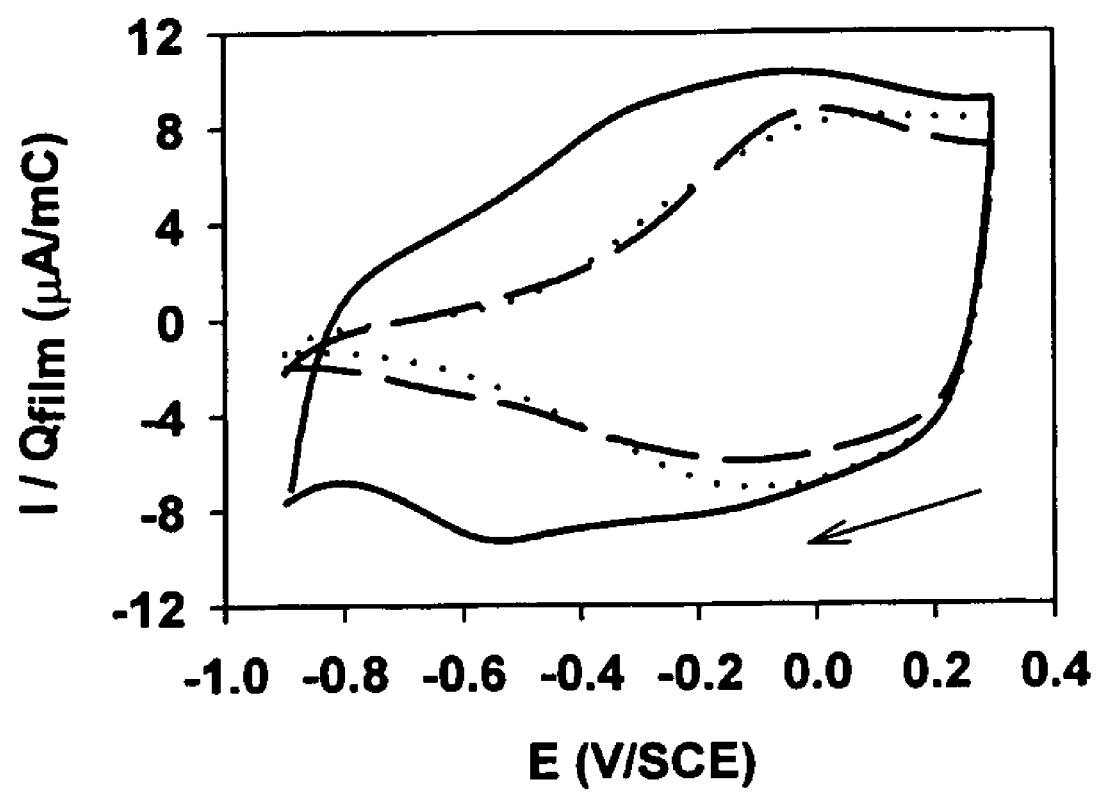
FIG. 7 shows cyclic voltammograms of PPy films with small $Q_{film}$ in 0.1M LiClO$_4$ monomer-free aqueous solutions. Scan rate: 100 mV/s; Potential range:−0.9-+0.3 V/SCE; Initial potential:−0.9 V/SCE.

FIG. 7 shows the cyclic voltammetry curves illustrating the influence of the CNT substrate on redox behavior of the surface coated thin PPy films in the conductive CNT electrode materials of the invention, and on reference flat metal surfaces (Pt and Ti). The redox curves shown in FIG. 7 are superimposed on a "capacitive" background, in a standard manner that is typically used in cyclic voltammetry measurements of conducting polymers, including PPy. For the uncoated CNT substrate, no significant redox peaks are observable from –0.9 V to +0.3 V in $LiClO_4$ aqueous solution. For the CNT electrode of the invention comprising a PPy-coated conductive CNT electrode material of the invention, on the other hand, the following differences are observed: 1) the charge increases at the negative end of the potential window, and redox behavior is observed at about –0.55 V; 2) a higher current density is observed at about –0.9 V, at which PPy is essentially electrically insulating. This is indicative of an enhanced electronic conductivity of the PPy film on the CNT array substrate for the conductive CNT electrode material of the invention, especially at negative potential, which is an important characteristic for a conductive polymer material to be applied in a reducing environment; 3) an enhancement in specific charge capacity relative to PPy on flat Pt/Ti surface is also observed for the conductive CNT electrode materials of the invention.

FIG. 8 shows cyclic voltammograms of the conductive CNT electrode materials of the invention containing PPy films of varying thickness in comparison to similar films grown on planar metallic substrates by the coating method of the invention. The cyclic voltammograms of PPy films on Pt, Ti, and a CNT array substrate with different thickness are shown in FIGS. 8a, 8b, and 8c, respectively. Although a similar trend is evident for PPy films on Pt and Ti, and the CNT array substrate, the charge-discharge rates for Pt and Ti surfaces are strongly influenced by the polymer film thickness (when $Q_{film}$ increases, i.e., the PPy film becomes thick, peak separation potential ($\Delta E_p$) increases and the typical charge-voltage (CV) characteristic of PPy gradually decreases). The CV characteristic of PPy-coated CNT electrode materials, on the other hand, unlike for Pt and Ti surfaces, is not significantly influenced by film formation charge ($Q_{film}$).

FIG. 9 shows the a comparison of the doping-undoping kinetics of PPy films deposited with large $Q_{film}$ for a normalized redox current by $Q_{film}$ in the conductive CNT electrode material of the invention. As evidenced in the figure, the CNT array substrate comprising the base for the conductive CNT electrode material speeds up the redox process. While the well-defined CV redox peaks disappear when $Q_{film}$ is about 645 $mC/cm^2$ for a PPy coated flat Ti substrate, a well-defined CV can is observable even when $Q_{film}$ is as high as 1308 $mC/cm^2$ for the PPy-coated conductive CNT electrode material of the invention. Further, the specific charge capacity of the PPy-coated conductive CNT electrode material is also greater than that of PPy films coated on flat metallic surfaces.

FIG. 10 shows the influence of electrically conductive polymer film formation charge ($Q_{film}$) on the redox charge ($Q_{redox}$) for the conductive CNT electrode material of the invention (which is estimated from the anodic charge illustrated in the cyclic voltammograms), in comparison to corresponding film formation on flat metallic substrates. In general, $Q_{redox}$ increases with $Q_{film}$ prior to reaching a certain threshold value, whereupon it starts to decrease with further increase of $Q_{film}$. It is evident from FIG. 10 that the difference is that $Q_{redox}$ increases with $Q_{film}$ more rapidly for the conductive CNT electrode materials of the invention containing a PPy-coating than similarly coated conventional flat electrodes comprised of metallic Pt and Ti substrates. Specifically, when $Q_{film}$ is around 680 mC/cm², $Q_{redox}$ improvements of about 2.5 and about 23 times have been achieved for the PPy coated conductive CNT electrode materials of the invention in comparison to PPy coated on flat Pt and Ti substrates, respectively.

The present invention provides conductive CNT electrode materials for the construction of electrodes possessing substantially improved electrochemical redox performance for use in electrical energy storage devices. Such characteristics are important for construction of lightweight high-efficiency devices such as rechargeable batteries. The conductive CNT electrode materials of the invention enable the utilization of thin, highly uniform films of electrically conducting polymers as stable, adherent surface coatings on carbon substrates of high surface area, particularly CNT substrates with well-aligned tubule morphologies. The electrical conductivity of the conductive CNT electrode materials of the invention can be further enhanced by introduction of suitable dopant materials in the conductive polymer coating. The dopant materials may be either n-type such as molecular iodine ($I_2$), or p-type such as tetrathiafulvalene (TTF) and tetracyanoquinodimethane (TCNQ) that can be introduced by standard methods. The in-situ polymerization of monomers directly on the substrate surface utilizing the CNT array substrates and methods of the invention enables the deposition of uniformly thin films of electrically conducting polymers such as PPy as defect free coatings with superior electrical properties, enable their use as electrodes in the manufacture of high-efficiency, light weight electrical storage devices, in comparison to conventional devices utilizing electrodes comprising coated flat metal substrates. The electrochemical in-situ polymerization method of the invention provides polymer growth currents, particularly for PPy, on the aligned CNT array substrates that is substantially greater than that on the flat Ti and Pt substrates, and the resulting conductive CNT electrode materials show significant improved electrochemical redox performance, especially for PPy films with large $Q_{film}$. The significantly enhanced redox charge of PPy films in the PPy coated CNT array substrates of the invention in comparison to conventional flat Ti and Pt substrates, enables their use as hybrid materials in high-performance light-weight rechargeable batteries.

Although examples are used herein to describe the invention in detail, it is understood that such detail is solely for the purpose of example, and variations and modifications can be made therein by those skilled in the art without departing from the spirit and scope of the invention.

EXAMPLES

Example 1

Synthesis of Well-aligned Carbon Nanotubes (CNTS)

Well-aligned carbon nanotubes were obtained by methods disclosed in the art (see Z. F. Ren, et al., Science 282 (1998) 1105; Z. P. Huang et al. Appl. Phys. Lett. 73 (1998) 26; Z. F. Ren, et al., Proceedings of the 13th International Winter School on Electronic Properties of Novel Materials, (1999) 263; Z. F. Ren, et al., Appl. Phys. Lett., 75 (1999) 1086; and Z. F. Ren, et al., Proceedings of the 32nd International Technical Conference of the Society for the Advancement of Materials and Process Engineering (SAMPE), Nov. 5-9, 2000, Boston, USA, pp. 200-204). Titanium (Ti) is used as base substrate upon which a thin nickel (Ni) layer of about 15-25 nm was surface coated by magnetron sputtering to function as a catalyst for CNT growth. The CNTs obtained by this method have tubule diameters ranging from 50-100 nm and tubule lengths of 8-10 μm. Tubule diameter and length is controlled by varying the Ni layer thickness and growth time, respectively.

Example 2

PPy Deposition and Electrochemical Measurements

PPy films were deposited on CNT substrates by in-situ polymerization of pyrrole potentiodynamically using a standard three-electrode cell from 17.3 mM pyrrole (Aldrich) and 0.1M $LiClO_4$ (Aldrich, A.C.S reagent) aqueous solutions. A PC4 potentiostat/Galvanostat (Gamary Instruments Inc., Warminster, Pa. 18974) was employed for the synthesis and cyclic voltammetric (CV) measurements of PPy films. Platinum wire was used as the counter electrode, and a saturated calomel electrode (SCE) was used as the reference electrode. Prior to PPy deposition, the CNT substrates were pretreated in 15% wt. HNO3 aqueous solution for 30 minutes to remove non-adherent metallic Ni catalyst particles and also to increase electrochemical activity of the surface of the CNTs in water and aqueous solutions. After PPy deposition, the substrates were soaked in double distilled water for 30 minutes to remove unreacted pyrrole monomer. Redox processes of the PPy-coated carbon nanotube electrodes were measured in monomer-free 0.1M $LiClO_4$ aqueous solution. Both prior to PPy deposition and the redox study, the solution was bubbled with nitrogen for 30 minutes to eliminate oxygen, and during the experiments, nitrogen gas was used as the protecting atmosphere. For comparison, PPy films were also electro-deposited on the flat metal substrates (titanium and platinum). In order to improve the adhesion of PPy on flat titanium (Ti) substrate, the pretreatment of Ti in dilute nitric acid (15% wt.) was carried out before the PPy deposition. All experiments were made in ambient temperature. All the potentials were referred to the saturated calomel electrode (SCE).

Example 3

Characteristics of PPy Films Polymerized on CNT Substrates

Film Thickness

PPy coatings obtained on CNT substrates via the in-situ polymerization methods provides highly uniform films on the surface of individual CNT tubules. A typical film thickness of about 90 nm is obtained by passing a charge of about 1308.6 mC/cm² on the outer surface of individual tubules. In comparison, film thickness of about 1.1 μm and about 1.5 μm, are obtained upon passing a charge of about 645 mC/cm² and about 933 mC/cm² on Ti and Pt surfaces respectively.

Film Morphology

PPy film morphologies are dependant on film thickness film formation charge ($Q_{film}$). A small film formation charge ($Q_{film}$) results in a thin PPy coating (about 8 to 10 nm), coated CNT substrates that are not free-standing. The CNT tubules form bundles as a result of surface tension. With increase in $Q_{film}$, the thickness of the PPy films on the tubule surface increases to about 90 nm, providing mechanically strong, coated tubules that are free-standing. Such coated CNT substrates (CNT electrode materials), comprising CNT tubule arrays, are entirely detachable from CNT catalyst surfaces.

Example 4

Electrical Properties of CNT Electrode Materials

Redox peaks for uncoated CNT substrates are insignificant in the range of about −0.9 V to about +0.3 V in $LiClO_4$ aqueous solution. For the CNT electrode materials (PPy coated CNT substrate) the electrical charge increases at the negative end of the potential window, and redox behavior is observed at about −0.55 V. A higher current density is also observed at about −0.9 V, at which PPy is essentially electrically insulating. The charge-discharge rates are strongly influenced by the PPy film thickness. The peak separation potential ($\Delta E_p$) increases with increasing film formation charge ($Q_{film}$) increases, i.e., the PPy film becomes thick, and the typical CV characteristic of PPy gradually decreases). The current-voltage (CV) characteristic for the CNT electrode materials remains substantially independent of by film formation charge ($Q_{film}$).

What is claimed is:

1. An electrical energy storage device comprising:
   a conductive carbon nanotube electrode material having a carbon nanotube substrate with a plurality of longitudinally aligned carbon nanotubules in a three-dimensional array; and
   at least one electrically conducting organic or organo-metallic polymer surface coating on a surface of the plurality of nanotubules establishing electrical continuity by producing contact throughout the three-dimensional array and cohesively holding together the plurality of nanotubules in the three-dimensional array,
   wherein a charge-discharge rate for the carbon nanotube electrode material remains substantially independent of a film formation charge of the electrically conducting surface coating.

2. The electrical energy storage device of claim 1 wherein the plurality of carbon nanotubules have a substantially linear configuration.

3. The electrical energy storage device of claim 1 wherein the surface coating has a film thickness ranging from about 50 nanometers to about 200 nanometers.

4. The electrical energy storage device of claim 1 wherein the surface coating is polypyrrole, polyaniline, polythiophene, polyacetylene or derivatives and combinations thereof.

5. The electrical energy storage device of claim 1 wherein the surface coating is polypyrrole.

6. The electrical energy storage device of claim 1 wherein the surface coating includes a dopant.

7. The electrical energy storage device of claim 1 wherein the plurality of carbon nanotubules form a free standing aggregate.

8. The electrical energy storage device of claim 7 wherein the free standing aggregate comprises a plurality of carbon nanotubules that are substantially aligned with one another along a longitudinal axis.

9. The electrical energy storage device of claim 1 wherein the electrical energy storage device is a battery, an energy storage cell, a sensor, a light-emitting diode, a capacitor, or an electrochromic display.

10. The electrical energy storage device of claim 1 wherein the electrical energy storage device is a rechargeable battery.

11. A rechargeable battery comprising a conductive carbon nanotube electrode material wherein an electrically conducting polymer film is coated on a surface of an array of longitudinally aligned linear carbon nanotubules to form at least one bundle, the bundle comprising an aggregate of a plurality of individual nanotubules randomly aligned in a series of parallel planes and cohesively held together by the electrically conducting polymer resulting in multiple points of contact among the plurality of nanotubules establishing electrical continuity throughout a three-dimensional array within each bundle.

12. The rechargeable battery of claim 11 wherein the carbon nanotube electrode material charges and discharges electrical energy.

13. The rechargeable battery of claim 11 wherein the carbon nanotubules have a substantially cylindrical, hollow morphology.

14. The rechargeable battery of claim 11 wherein the carbon nanotube electrode material is porous.

15. The electrical energy storage device of claim 1 wherein the carbon nanotubules have a substantially cylindrical, hollow morphology.

16. A high charge capacity electrical energy storage device for charging and discharging electrical energy comprising at least one aggregate of a porous conductive carbon nanotube electrode, wherein the porous conductive carbon nanotube electrode includes a plurality of randomly aligned carbon nanotubules cohesively held together with an electrically conducting organic or organic-metallic polymer film coating that uniformly coats a surface of the plurality of carbon nanotubules.

17. The electrical energy storage device of claim 16 wherein the polymer film coating has a thickness ranging from about 50 nanometers to about 200 nanometers.

18. The electrical energy storage device of claim 16 wherein the plurality of randomly aligned carbon nanotubules are substantially aligned with one another along a longitudinal axis.

19. The electrical energy storage device of claim 16 wherein the polymer film coating is polypyrrole, polyaniline, polythiophene, polyacetylene or derivatives and combinations thereof.

* * * * *